United States Patent
Hosoya

(10) Patent No.: US 7,750,716 B2
(45) Date of Patent: Jul. 6, 2010

(54) VARIABLE RESISTOR, FILTER, VARIABLE GAIN AMPLIFIER AND INTEGRATED CIRCUIT USING THE VARIABLE RESISTOR

(75) Inventor: Masahiro Hosoya, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/187,074

(22) Filed: Aug. 6, 2008

(65) Prior Publication Data

US 2009/0039955 A1 Feb. 12, 2009

(30) Foreign Application Priority Data

Aug. 9, 2007 (JP) ............................. 2007-208095

(51) Int. Cl.
*H03L 5/00* (2006.01)
(52) U.S. Cl. ..................................... 327/308; 333/81 R
(58) Field of Classification Search ................. 327/306, 327/308, 552–558; 333/81 R
See application file for complete search history.

(56) References Cited

U.S. PATENT DOCUMENTS

| 3,304,487 | A | * | 2/1967 | McCaskey, Jr. | ............... | 363/86 |
| 6,573,811 | B2 | * | 6/2003 | Martin | ....................... | 333/172 |
| 7,180,939 | B2 | * | 2/2007 | Palaskas et al. | ............. | 375/229 |

FOREIGN PATENT DOCUMENTS

JP 360015979 A * 1/1985

OTHER PUBLICATIONS

Kousai, S. et al., "A 19.7 MHz, Fifth-Order Active-*RC* Chebyshev LPF for Draft IEEE802.11n With Automatic Quality-Factor Tuning Scheme," IEEE Journal of Solid-State Circuits, vol. 42, No. 11, pp. 2326-2337, (Nov. 2007).

* cited by examiner

*Primary Examiner*—Dinh T. Le
(74) *Attorney, Agent, or Firm*—Finnegan, Henderson, Farabow, Garrett & Dunner, L.L.P.

(57) ABSTRACT

A variable resistor formed on a silicon substrate, and changing a resistance value between an input terminal and an output terminal, includes a plurality of first resistors each having one end connected in common to the input terminal, and each having other end, a plurality of second resistors each having a resistance value smaller than the first resistors, and each having one end connected to the other end of any one of the first resistors, and a switch group interposed between the input terminal and the output terminal, and selecting one from the first resistors, and further, selecting at least one from the second resistors connected to the other end of the selected first resistor.

11 Claims, 14 Drawing Sheets

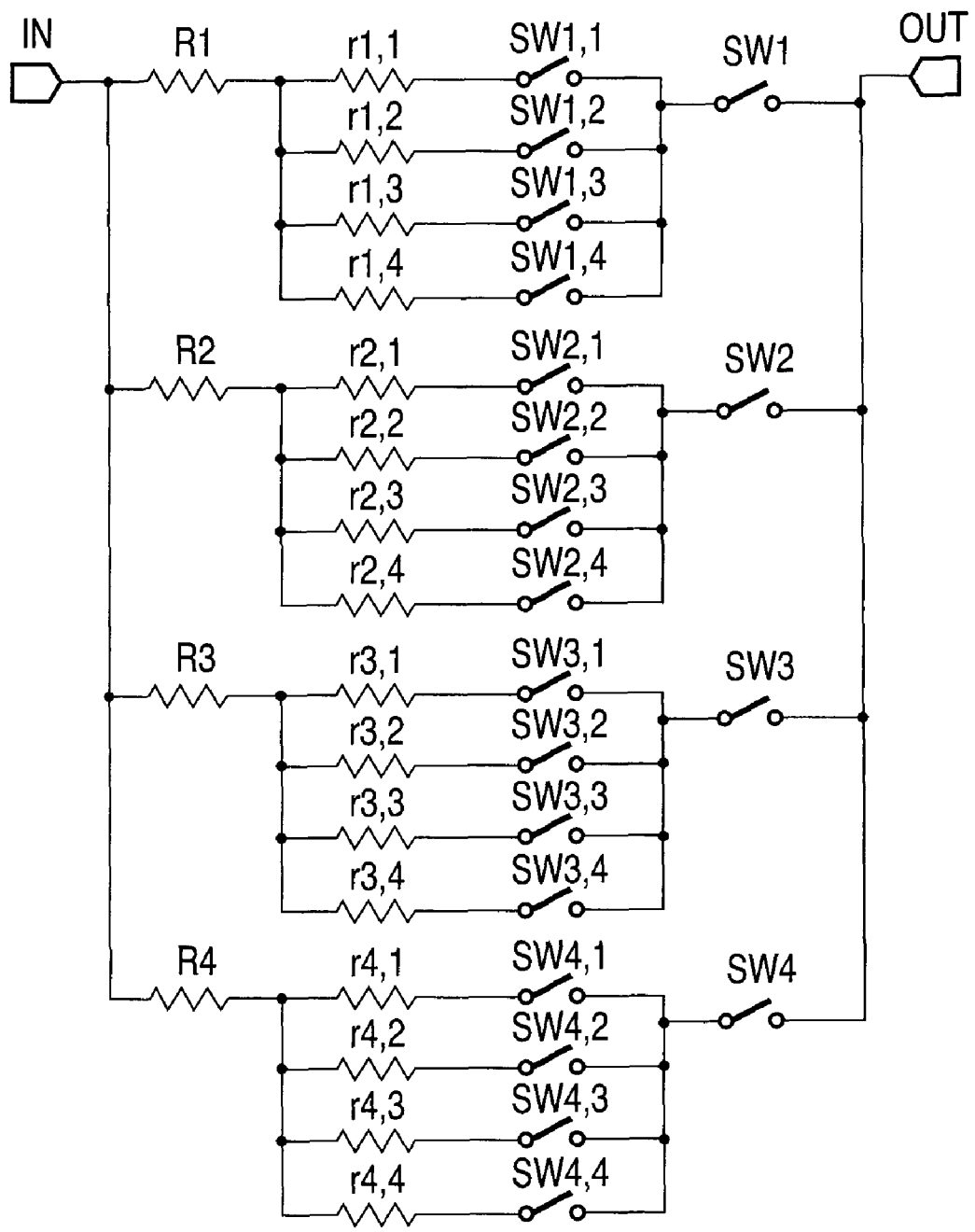
F I G. 3

| Control code | SWi,1 | SWi,2 | SWi,3 | SWi,4 | SW1 | SW2 | SW3 | SW4 |
|---|---|---|---|---|---|---|---|---|
| 0000 | On | — | — | — | On | — | — | — |
| 0001 | — | On | — | — | On | — | — | — |
| 0010 | — | — | On | — | On | — | — | — |
| 0011 | — | — | — | On | On | — | — | — |
| 0100 | On | — | — | — | — | On | — | — |
| 0101 | — | On | — | — | — | On | — | — |
| 0110 | — | — | On | — | — | On | — | — |
| 0111 | — | — | — | On | — | On | — | — |
| 1000 | On | — | — | — | — | — | On | — |
| 1001 | — | On | — | — | — | — | On | — |
| 1010 | — | — | On | — | — | — | On | — |
| 1011 | — | — | — | On | — | — | On | — |
| 1100 | On | — | — | — | — | — | — | On |
| 1101 | — | On | — | — | — | — | — | On |
| 1110 | — | — | On | — | — | — | — | On |
| 1111 | — | — | — | On | — | — | — | On |

F I G. 4

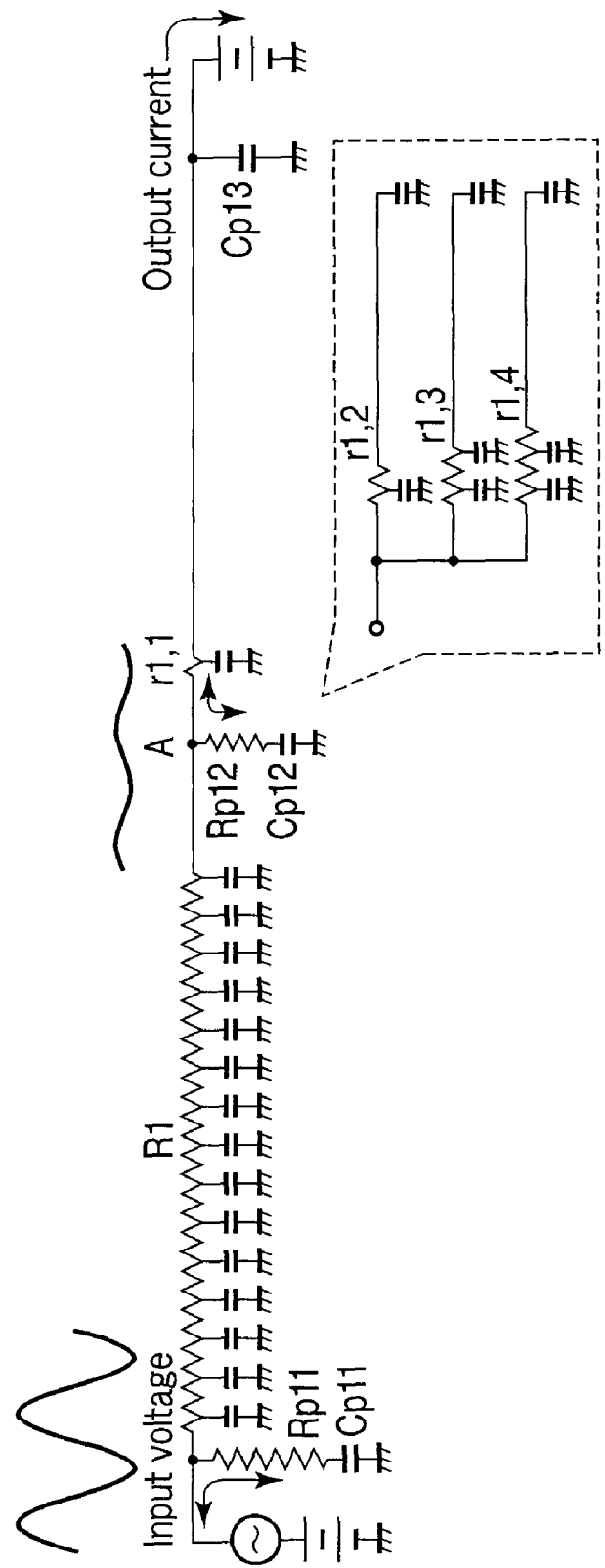
F I G. 6

| Control code | SW1,1 | SW1,2 | SW1,3 | SW1,4 | SW2,1 | SW2,2 | SW2,3 | SW2,4 | SW3,1 | SW3,2 | SW3,3 | SW3,4 | SW4,1 | SW4,2 | SW4,3 | SW4,4 |
|---|---|---|---|---|---|---|---|---|---|---|---|---|---|---|---|---|
| 0000 | On | – | – | – | – | – | – | – | – | – | – | – | – | – | – | – |
| 0001 | – | On | – | – | – | – | – | – | – | – | – | – | – | – | – | – |
| 0010 | – | – | On | – | – | – | – | – | – | – | – | – | – | – | – | – |
| 0011 | – | – | – | On | – | – | – | – | – | – | – | – | – | – | – | – |
| 0100 | – | – | – | – | On | – | – | – | – | – | – | – | – | – | – | – |
| 0101 | – | – | – | – | – | On | – | – | – | – | – | – | – | – | – | – |
| 0110 | – | – | – | – | – | – | On | – | – | – | – | – | – | – | – | – |
| 0111 | – | – | – | – | – | – | – | On | – | – | – | – | – | – | – | – |
| 1000 | – | – | – | – | – | – | – | – | On | – | – | – | – | – | – | – |
| 1001 | – | – | – | – | – | – | – | – | – | On | – | – | – | – | – | – |
| 1010 | – | – | – | – | – | – | – | – | – | – | On | – | – | – | – | – |
| 1011 | – | – | – | – | – | – | – | – | – | – | – | On | – | – | – | – |
| 1100 | – | – | – | – | – | – | – | – | – | – | – | – | On | – | – | – |
| 1101 | – | – | – | – | – | – | – | – | – | – | – | – | – | On | – | – |
| 1110 | – | – | – | – | – | – | – | – | – | – | – | – | – | – | On | – |
| 1111 | – | – | – | – | – | – | – | – | – | – | – | – | – | – | – | On |

FIG. 11

| Control code | SW11,0 | SW11,1 | SW11,2 | SW12,0 | SW12,1 | SW12,2 | SW13,0 | SW13,1 | SW13,2 | SW14,0 | SW14,1 | SW14,2 |
|---|---|---|---|---|---|---|---|---|---|---|---|---|
| 0000 | On | – | – | – | – | – | – | – | – | – | – | – |
| 0001 | – | On | – | – | – | – | – | – | – | – | – | – |
| 0010 | – | On | On | – | – | – | – | – | – | – | – | – |
| 0011 | – | – | On | – | – | – | – | – | – | – | – | – |
| 0100 | – | – | – | On | – | – | – | – | – | – | – | – |
| 0101 | – | – | – | – | On | – | – | – | – | – | – | – |
| 0110 | – | – | – | – | On | On | – | – | – | – | – | – |
| 0111 | – | – | – | – | – | On | – | – | – | – | – | – |
| 1000 | – | – | – | – | – | – | On | – | – | – | – | – |
| 1001 | – | – | – | – | – | – | – | On | – | – | – | – |
| 1010 | – | – | – | – | – | – | – | On | On | – | – | – |
| 1011 | – | – | – | – | – | – | – | – | On | – | – | – |
| 1100 | – | – | – | – | – | – | – | – | – | On | – | – |
| 1101 | – | – | – | – | – | – | – | – | – | – | On | – |
| 1110 | – | – | – | – | – | – | – | – | – | – | On | On |
| 1111 | – | – | – | – | – | – | – | – | – | – | – | On |

F I G. 13

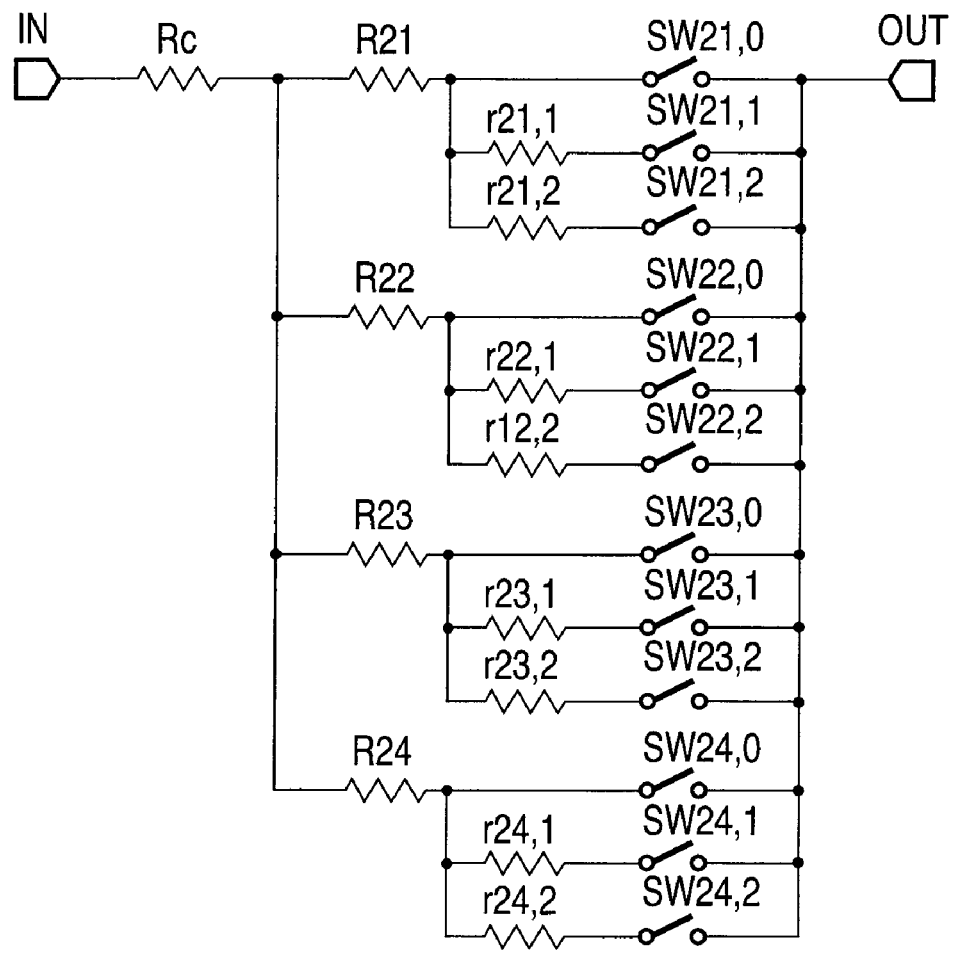
F I G. 14
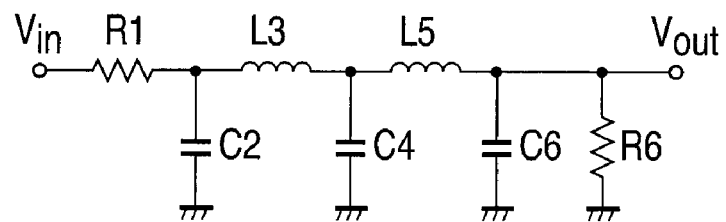
F I G. 15A

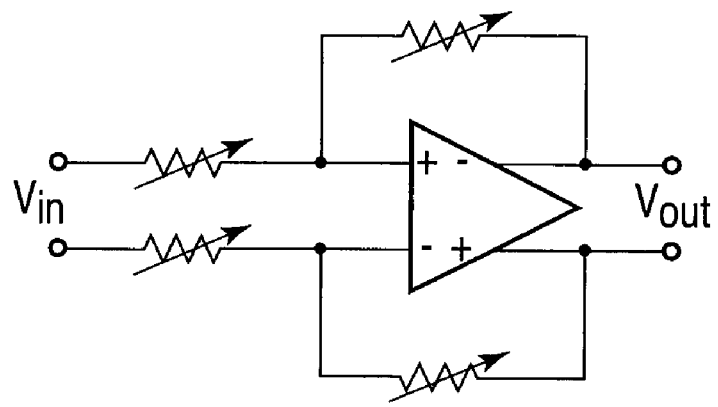
F I G. 16
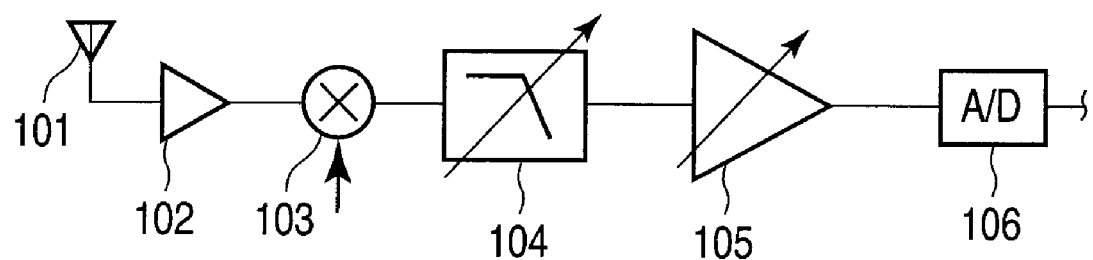
F I G. 17

VARIABLE RESISTOR, FILTER, VARIABLE GAIN AMPLIFIER AND INTEGRATED CIRCUIT USING THE VARIABLE RESISTOR

CROSS-REFERENCE TO RELATED APPLICATIONS

This application is based upon and claims the benefit of priority from prior Japanese Patent Application No. 2007-208095, filed Aug. 9, 2007, the entire contents of which are incorporated herein by reference.

BACKGROUND OF THE INVENTION

1. Field of the Invention

The present invention relates to a variable resistor formed on a silicon substrate, a filter, a variable gain amplifier and an integrated circuit using the variable resistor.

2. Description of the Related Art

Conventionally, there has been known the following variable resistor. The variable resistor is composed of common resistors, a plurality of tuning resistors and switches. The tuning resistors connected to the common resistor are switched via the foregoing switches, and thereby, a desired resistance value is obtained.

When a variable resistor is formed on a silicon substrate, a parasitic capacitance occurs between the substrate and the variable resistor. The parasitic capacitance between the substrate and the variable resistor is a factor of causing a signal phase delay. In addition, when the tuning resistors are switched, a voltage division ratio of the common resistor and the tuning resistors changes. For this reason, voltage amplitude of a node between the common resistors and the tuning resistors is not constant. Thus, an influence of a parasitic capacitance between the node and the substrate is not constant; as a result, fluctuation occurs in the signal phase delay. For example, if a filter is configured using the foregoing variable resistor, a filter characteristic is deteriorated due to the foregoing fluctuation of signal phase delay.

The following document describes a Quality-factor tuning circuit to control the foregoing fluctuation of signal phase delay.

Document: S. Kousai et al, "A 19.7 MHz, $5^{th}$ Oder Active-RC Chebyshev LPF for IEEE 802.11n with Automatic Quality Factor Tuning Scheme," A-SSCC 2006

When the conventional variable resistor is formed on the silicon substrate, following problems occur. Specifically, a signal phase delay occurs due to a parasitic capacitance and fluctuation of the phase delay occurs. If the phase delay is constant, the phase delay is canceled using a circuit technique. However, a complicated tuning circuit such as a Q tuning circuit is required to control the fluctuation of phase delay. As a result, this is a factor that leads to an increase in the circuit complexity.

BRIEF SUMMARY OF THE INVENTION

According to an aspect of the invention, there is provided a variable resistor formed on a silicon substrate, and changing a resistance value between an input terminal and an output terminal, comprising: a plurality of first resistors each having one end connected in common to the input terminal, and each having other end; a plurality of second resistors each having a resistance value smaller than the first resistors, and each having one end connected to the other end of any one of the first resistors; and a switch group interposed between the input terminal and the output terminal, and selecting one from the first resistors, and further, selecting at least one from the second resistors connected to the other end of the selected first resistor.

According to another aspect of the invention, there is provided a variable resistor formed on a silicon substrate, and changing a resistance value between an input terminal and an output terminal, comprising: a first resistor having one end connected to the input terminal, and having other end; a plurality of second resistors each having one end connected in common to the other end of the first resistor, and each having other end; a plurality of third resistors each having a resistance value smaller than the second resistors, and each having one end connected to the other end of any one of the second resistors; and a switch group interposed between the other end of the first resistor and the output terminal, and selecting one from the second resistors, and further, selecting at least one from the third resistors connected to the other end of the selected second resistor.

BRIEF DESCRIPTION OF THE SEVERAL VIEWS OF THE DRAWING

FIG. 3 is a circuit diagram showing one example of the variable resistor shown in FIG. 1;

FIG. 4 is a table showing the correspondence of control codes and on/off of switches in the variable resistor shown in FIG. 3;

FIG. 6 is a view conceptually showing parasitic elements when a resistance value of the variable resistor of FIG. 3 is the minimum;

FIG. 11 is a table showing the correspondence of control codes and on/off of switches in the variable resistor shown in FIG. 10;

FIG. 13 is a table showing the correspondence of control codes and on/off of switches in the variable resistor shown in FIG. 12;

FIG. 14 is a circuit diagram showing a variable resistor according to a fourth embodiment;

FIG. 15A is a circuit diagram showing a fifth-order resistance doubly terminated type LC filter;

FIG. 16 is a circuit diagram showing a variable gain amplifier configured using the variable resistor according to any of the first to fourth embodiments; and FIG. 17 is a block diagram showing a receiver configured using the active filter of FIG. 15B and the variable gain amplifier shown in FIG. 16.

DETAILED DESCRIPTION OF THE INVENTION

Various embodiment of the present invention will be hereinafter described with reference to the accompanying drawings.

First Embodiment

Figure 1:
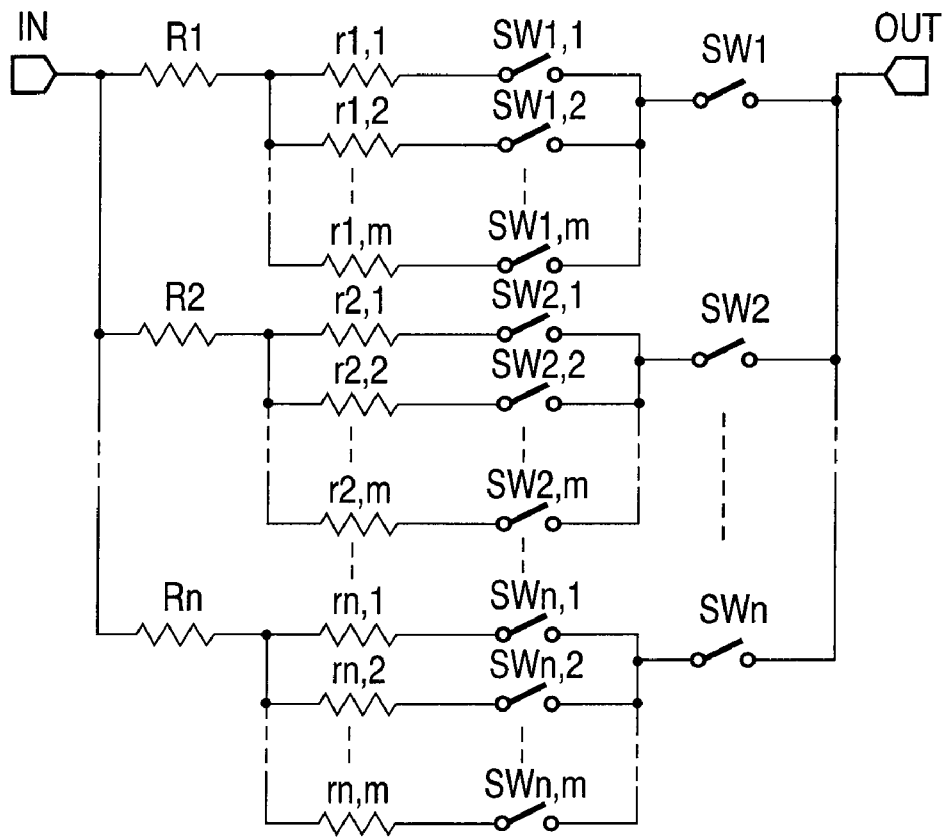
FIG. 1 is a circuit diagram showing a variable resistor according to a first embodiment.

As shown in FIG. 1, a variable resistor according to a first embodiment of the present invention includes a voltage input terminal IN, coarse tuning resistors R, coarse tuning switches SW, fine tuning resistors r, fine tuning switches SW and a current output terminal OUT. In the variable resistor of FIG. 1, one is selected from n (n is an arbitrary integer more than 2) coarse tuning resistors R by the coarse tuning switch SW. Further, one is selected from m (m is an arbitrary integer more than 2) fine tuning resistors r connected to the selected coarse tuning resistor R by the fine tuning switch SW. In this case, the number of the fine tuning resistors r connected to each of the coarse tuning resistor R need not be set to the same number. In the following description, the number of the fine tuning resistors r connected to each of the coarse tuning resistor R is set to m. In the variable resistor shown in FIG. 1, coarse and fine tuning resistors R and r are switched by coarse and fine tuning switches, and thereby, m×n kinds of resistance values are realized.

One ends of n coarse tuning resistors $R_1, R_2, \ldots, R_n$ (the resistance values are each $R_1, R_2, \ldots, R_n$) are connected in parallel with the voltage input terminal IN. For simplification of explanation, the coarse tuning resistors $R_1, R_2, \ldots, R_n$ are arranged in ascending order from the small resistance value. In other words, the relationship of the n resistance values is $R_1 < R_2 < \ldots < R_n$.

The other end of each of the coarse tuning resistors $R_1$, $R_2, \ldots, R_n$ is connected with m fine tuning resistors r in parallel. For simplification of explanation, the tuning resistors $r_{i,1}, r_{i,2}, \ldots, r_{i,m}$ (the resistance values are each set to $r_{i,1}$, $r_{i,2}, \ldots, r_{i,m}$) connected to the same coarse tuning resistor Ri (i is an arbitrary integer more than 1 and less than n) are arranged in ascending order of resistance value. In other words, the relationship of the m resistance values is $r_{i,1} < r_{i,2} < \ldots < r_{i,m}$. The resistance value of all fine tuning resistors r is smaller than the minimum resistance value $R_1$ in n coarse tuning resistors R.

Figure 2:
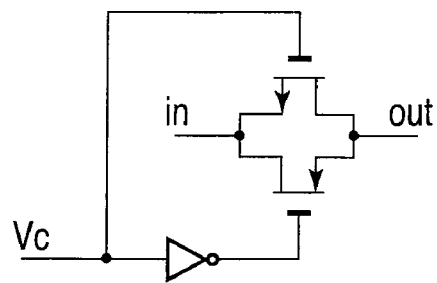
FIG. 2 is a circuit diagram showing the switch shown in FIG. 1.

One end of each of the fine tuning switches $SW_{i,j}$ (j is an arbitrary integer more than 1 and less than m) is connected in series to the other end of each of the fine tuning resistors $r_{i,j}$. On/off of the fine tuning switches SW is controlled by a control signal. Specifically, the fine tuning switch SW comprises a MOS transistor pair as shown in FIG. 2. In this case, the gate terminals of the MOS transistor pair receive a control signal Vc and an inverted signal of the control signal Vc. By the MOS transistor pair, an input terminal in and an output terminal out are connected or opened, and thereby, on/off of the switch is realized. The other ends of the foregoing fine tuning switches $SW_{i,1}, SW_{i,2}, \ldots, SW_{i,m}$ is connected in common.

The coarse tuning switch $SW_i$ is interposed between the other ends of fine tuning switches $SW_{i,1}, SW_{i,2}, \ldots, SW_{i,m}$ and the current output terminal OUT. The on/off of the coarse tuning switch $SW_i$ is controlled by the control signal.

The foregoing coarse and fine tuning switches SW may be provided on the side of the voltage input terminal IN, and not on the side of the current output terminal OUT. However, in this case, these switches SW are arranged on the side of the current output terminal OUT, and thereby, non-linear signal distortion is suppressed.

In the variable resistor of FIG. 1, one of the coarse tuning switches SW and one of the fine tuning switches SW are each turned on according to the control signal. In this way, the coarse tuning resistor $R_i$ and the fine tuning resistor $r_{i,j}$ connected to the coarse tuning resistor $R_i$ are selected to realize a resistance value $R_i+r_{i,j}$. In other words, the variable resistor of FIG. 1 discretely changes the resistance value in accordance with the control signal.

Preferably, the coarse tuning resistor R and the fine tuning resistor r satisfy the following relational expression:

$$R_i + r_{i,1} > R_{i-1} + r_{i-1,m} \quad (1)$$

Specifically, when the coarse tuning resistor R is selected so that the resistance value becomes high, the resistance value R+r of the variable resistor is set to necessarily become high regardless of selecting any of the fine tuning resistors r. To give an example, a technical significance of satisfying the foregoing expression (1) will be explained below.

For example, four resistance values 22, 24, 26 and 28 kΩ are realized using two coarse tuning resistors $R_1$, $R_2$, four fine tuning resistors $r_{1,1}$, $r_{1,2}$, $r_{2,1}$ and $r_{2,2}$. According to a first example, resistance values $R_1=21$ kΩ, $R_2=25$ kΩ, $r_{1,1}=r_{2,1}=1$ kΩ, and $r_{1,2}=r_{2,2}=3$ kΩ are set. The first example satisfies the expression (1). According to a second example, resistance values $R_1=21$ kΩ, $R_2=23$ kΩ, $r_{1,1}=r_{2,1}=1$ kΩ, and $r_{1,2}=r_{2,12}=5$ kΩ are set. The second example dose not satisfy the expression (1) because the second example has relationship of $R_2+r_{2,1} > R_1+r_{1,2}$.

Now, an influence of a parasitic capacitance in a node between the coarse tuning resistor R and the fine tuning resistor r will be considered. In this case, it is preferable that the voltage amplitude of the node be smaller. The voltage amplitude depends on a voltage division ratio (r/(R+r), R: resistance value of coarse tuning resistor, r: resistance value of fine tuning resistor). The smaller the voltage division ratio is, the smaller the voltage amplitude becomes.

According to the foregoing first example, the maximum voltage division ratio is obtained in the case of realizing the resistance value 24 kΩ ($R_1=21$ kΩ, $r_{1,2}=3$ kΩ). In this case, the voltage division ratio of the node is 3/(21+3)=1/8. On the other hand, according to the second example, the maximum voltage division ratio is obtained in the case of realizing the resistance value 26 kΩ ($R_1=21$ kΩ, $r_{1,2}=5$ kΩ). In this case, the voltage division ratio is 5/(21+5)≈1/5.

According to the foregoing first example, the minimum voltage division ratio is obtained in the case of realizing the resistance value 26 kΩ ($R_2=25$ kΩ, $r_{2,1}=1$ kΩ). In this case, the voltage division ratio of the node is 1/(25+1)=1/26. On the other hand, according to the second example, the minimum voltage division ratio is obtained in the case of realizing the resistance value 24 kΩ ($R_2=23$ kΩ, $r_{2,1}=1$ kΩ). In this case, the voltage division ratio is 1/(23+1)=1/24.

As seen from the comparison between the maximum and minimum voltage division ratio, the smaller value is obtained according to the first example in both cases. To make a comparison in the spread between the maximum value and the minimum value of the voltage division ratio, the first example is (1/8)≈(1/26)=3.25. The second example is (1/5)≈(1/24)=4.8. Thus, according to the first example, it can be seen that a change of the voltage division ratio by selecting the resistance is smaller than the second example.

Therefore, according to the first example of satisfying the expression (1), the voltage division ratio is smaller than the second example, and the voltage amplitude of the node becomes small. In addition, in the first example, a change of the voltage division ratio, that is, the voltage amplitude is smaller than in the second example. Thus, it is possible to suppress fluctuation of signal phase delay.

A variable resistor capable of switching 16 resistance values will be described with reference to FIG. 3 as one example of the variable resistor according to this embodiment. A variable resistor shown in FIG. 3 can switch 16 resistance values using four coarse tuning resistors $R_1$, $R_2$, $R_3$ and $R_4$ (the resistance value is $R_1$, $R_2$, $R_3$ and $R_4$) and 16 fine tuning resistors $r_{1,1}$, $r_{1,2}$, $r_{1,3}$, $r_{1,4}$, $r_{2,1}$, ..., $r_{4,4}$ (the resistance value is $r_{1,1}$, $r_{1,2}$, $r_{1,3}$, $r_{1,4}$, $r_{2,1}$, ..., $r_{4,4}$). In FIG. 3, the number of the coarse tuning resistors R and the number of the fine tuning resistors r connected to the coarse tuning resistors R are set to an arrangement of 4×4. The arrangement is not limited to the above, and an arrangement 2×8 and 8×2 may be employed. In addition, a different number of fine tuning resistors r may be allocated to each of the coarse tuning resistors. Many coarse tuning resistors R are provided, and thereby, a fine tuning width realized by the fine tuning resistors r is set smaller. Thus, the voltage amplitude of the node between the coarse tuning resistor R and the fine tuning resistor r is easily decreased. For this reason, the foregoing resistor configuration is not affected by the phase delay due to a parasitic capacitance. However, many coarse tuning resistors R are provided, and thereby, the circuit area increases. For this reason, the number of the coarse tuning resistors R is not simply increased, but must be properly set based on the specification required for the variable resistor.

In the variable resistor shown in FIG. 3, each on/off of coarse tuning switches SW and fine tuning switches SW is controlled by a control signal expressed by a 4-bit control code. The relationship between the control code and each on/off of coarse tuning switches and fine tuning switches is not specially limited. In the following description, the on/off of the switches is controlled according to a table shown in FIG. 4. As seen from FIG. 4, the upper 2-bit of the control code controls on/off of the coarse tuning switch SW. When the upper 2-bit of the control code is "00", the coarse tuning switch $SW_1$ is turned on. When the upper 2-bit of the control code is "01", the coarse tuning switch $SW_2$ is turned on. When the upper 2-bit of the control code is "10", the coarse tuning switch $SW_3$ is turned on. When the upper 2-bit of the control code is "11", the coarse tuning switch $SW_4$ is turned on. On the other hand, the lower 2-bit of the control code controls on/off of the fine tuning switch SW. When the lower 2-bit of the control code is "00", the fine tuning switch $SW_{i,1}$ is turned on. When the lower 2-bit of the control code is "01", the fine tuning switch $SW_{i,2}$ is turned on. When the lower 2-bit of the control code is "10", the fine tuning switch $SW_{i,3}$ is turned on. When the lower 2-bit of the control code is "11", the fine tuning switch $SW_{i,4}$ is turned on.

More specifically, as the bit value of the control code increases from "0000" to "1111", the resistance value of the variable resistor shown in FIG. 3 monotonously increases. In other words, the variable resistor shown in FIG. 3 realizes the minimum resistance value $R_1+r_{1,1}$ when the control code is "0000" while realizes the maximum resistance value $R_4+r_{4,4}$ when the control code is "1111".

Figure 5:
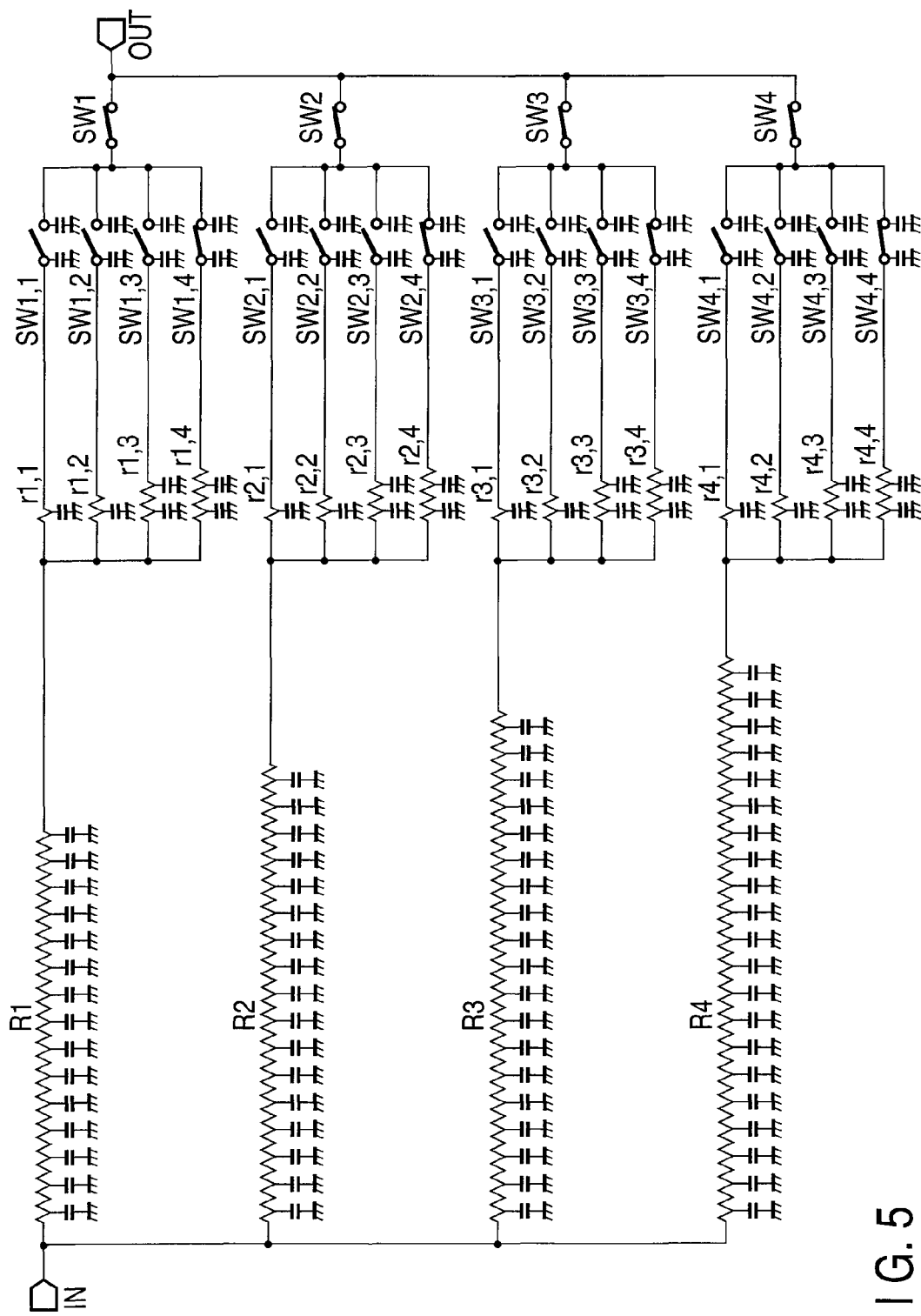
FIG. 5 is a view conceptually showing parasitic capacitances in the variable resistor shown in FIG. 3.

FIG. 5 shows a parasitic capacitance between the variable resistor of FIG. 3 and the substrate. In FIG. 5, the coarse tuning resistor R and the fine tuning resistor r are conceptually shown in a state that each length is changed in accordance with the resistance value. Hereinafter, with reference to FIG. 6 and FIG. 7, an influence of the parasitic capacitance when the resistance value of the variable resistor of FIG. 3 is the minimum ($R_1+r_{1,1}$) and the maximum ($R_4+r_{4,4}$) will be qualitatively explained.

FIG. 6 shows an equivalent circuit of the variable resistor of FIG. 3 having the minimum resistance value $R_1+r_{1,1}$. In this case, the length of the resistor is conceptually shown in a state of being changed in accordance with the resistance value similar to FIG. 5. In FIG. 6, coarse tuning resistors $R_2$, $R_3$ and $R_4$, fine tuning resistors $r_{2,1}$, $r_{2,2}$, $r_{2,3}$, $r_{3,1}$, ..., $r_{4,4}$, which are connected to turned-off coarse tuning switches SW2, SW3 and SW4, and parasitic capacitance of these resistors and switches are cut off from the current output terminal OUT. Thus, these resistors and parasitic capacitance of them are equivalently connected as a parasitic resistor $R_{p11}$ between the voltage input terminal IN and ground and a parasitic capacitor $C_{p11}$ connected in series to the parasitic resistor $R_{p11}$.

The parasitic resistor $R_{p11}$ receives an influence of coarse tuning resistors $R_2$, $R_3$ and $R_4$, which are not used. For this reason, the resistance value is relatively high, thus the parasitic capacitor $C_{p11}$ does not cause any phase delay. The voltage input terminal IN is driven by a voltage source; therefore, most of the phase delay current output from the parasitic capacitor $C_{p11}$ flows into the voltage source. As a result, an output current is not affected.

Fine tuning resistors $r_{1,2}$, $r_{1,3}$ and $r_{1,4}$ connected to tuned-off fine tuning switches $SW_{1,2}$, $SW_{1,3}$ and $SW_{1,4}$ and parasitic capacitance of these resistors and switches are equivalently connected as a parasitic resistor $R_{p12}$ between a node A between the coarse tuning resistor and the fine tuning resistor and ground and a parasitic capacitor $C_{p12}$ connected in series to the parasitic resistor $R_{p12}$. In the variable resistor of this embodiment, the voltage amplitude of the node A is set sufficiently smaller by a resistive voltage division. In addition, the capacitance value of the parasitic capacitor $C_{p12}$ is small; therefore, the amplitude of phase delayed current output from the parasitic capacitor $C_{p12}$ is also small. Thus, the output current is not affected. A parasitic capacitor $C_{p13}$ connected to the current output terminal OUT receives almost no influence because the voltage amplitude of the current output terminal OUT is very small.

Figure 7:
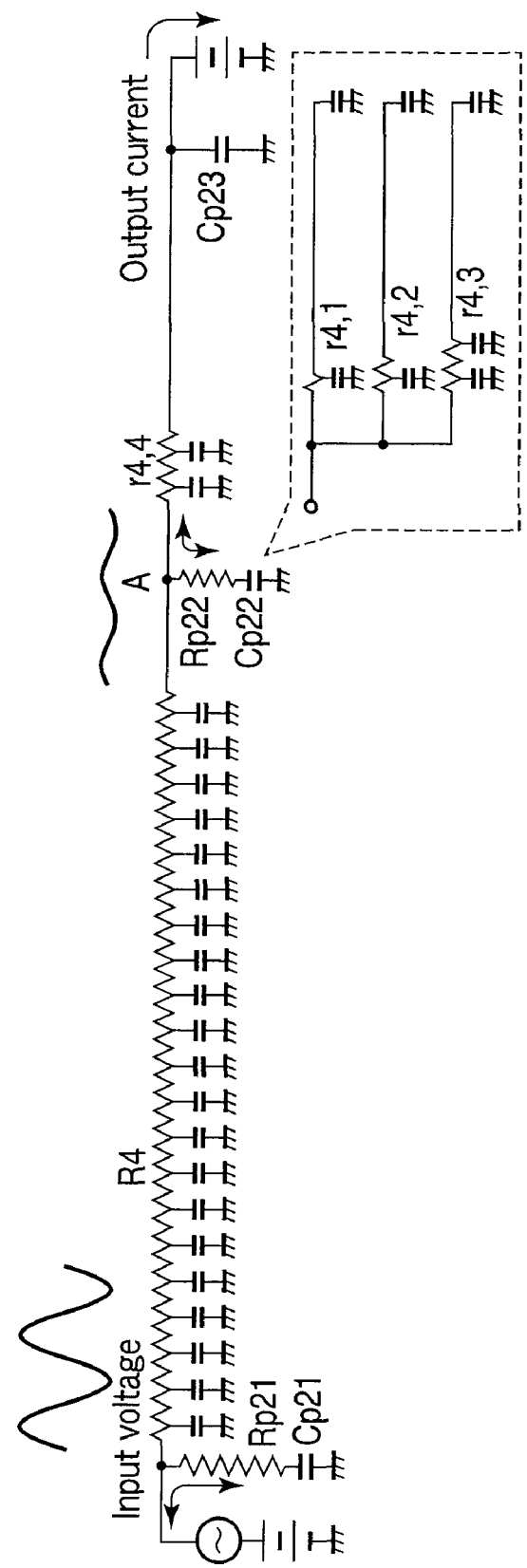
FIG. 7 is a view conceptually showing parasitic elements when a resistance value of the variable resistor of FIG. 3 is the maximum.

FIG. 7 shows an equivalent circuit of the variable resistor of FIG. 3 having the maximum resistance value $R_4+r_{4,4}$. In this case, FIG. 7 is shown in the same state as FIG. 6. In FIG. 7, coarse tuning resistors $R_1$, $R_2$ and $R_3$, fine tuning resistors $r_{1,1}$, $r_{1,2}$, $r_{1,3}$, $r_{1,4}$, $r_{2,1}$, ..., $r_{3,4}$, which are connected to turned-off coarse tuning switches SW1, SW2 and SW3, and parasitic capacitance of these resistors and switches are cut off from the current output terminal OUT. Thus, the resistors are equivalently connected as a parasitic resistor $R_{p21}$ between the voltage input terminal IN and ground and a capacitor $C_{p21}$ connected in series to the parasitic resistor $R_{p21}$.

The parasitic resistor $R_{p21}$ receives an influence of coarse tuning resistors $R_1$, $R_2$ and $R_3$, which are not used. For this reason, the resistance value is relatively high, thus the parasitic capacitance $C_{p21}$ does not cause any phase delay. The current input terminal IN is driven by a voltage source; therefore, most of the phase delayed current output from the parasitic capacitance $C_{p21}$ flows into the voltage source. As a result, an output current is not affected.

Fine tuning resistors $r_{4,1}$, $r_{4,2}$ and $r_{4,3}$ connected to tuned-off fine tuning switches $SW_{4,1}$, $SW_{4,2}$ and $SW_{4,3}$ and parasitic capacitance of these resistors and switches are equivalently connected as a parasitic resistor $R_{p22}$ between a node A between the coarse tuning resistor and the fine tuning resistor and ground and a parasitic capacitor $C_{p22}$ connected in series to the parasitic capacitor $C_{p22}$. In the variable resistor of this embodiment, the voltage amplitude of the node A is set sufficiently smaller by a resistive voltage division. In addition, the capacitance value of the parasitic capacitor $C_{p22}$ is small; therefore, the amplitude of phase delayed current output from the parasitic capacitor $C_{p22}$ is also small. Thus, the output current is not affected. A parasitic capacitor $C_{p23}$ connected to the current output terminal OUT receives almost no influence because the voltage amplitude of the current output terminal OUT is very small.

Figure 8:
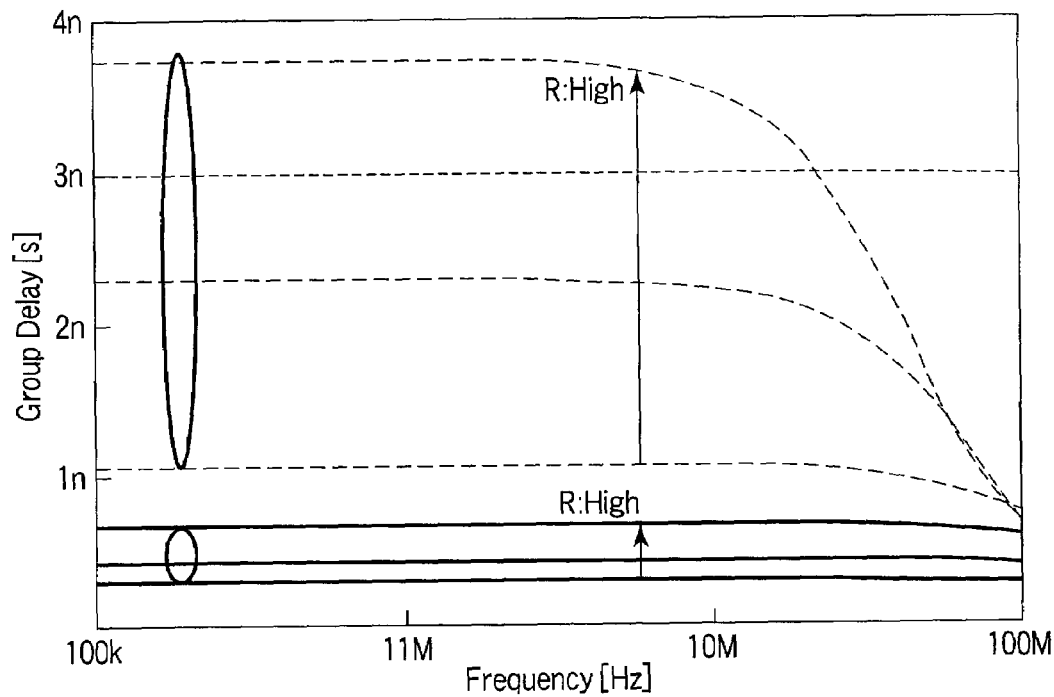
FIG. 8 is a graph showing group delay characteristics of the variable resistor of FIG. 3 and a variable resistor according to a conventional example.
Figure 9:
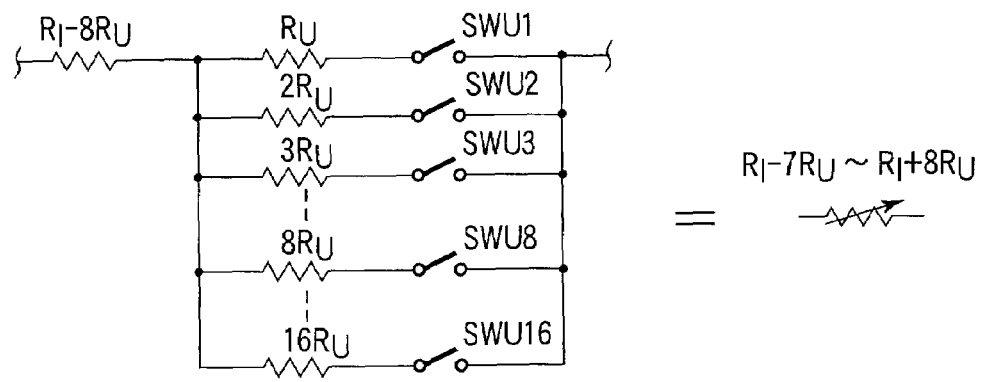
FIG. 9 is a circuit diagram showing a variable resistor according to the conventional example.

With reference to FIG. 8, an influence of the parasitic capacitance in the variable resistor of FIG. 3 will be quantitatively explained below using a comparison with the conventional example. As shown in FIG. 9, the comparison target, that is, a conventional variable resistor is composed of a common resistor $R_f$-$8R_U$, 16 tuning resistors $R_U$, $2R_U$, ..., $16R_U$ (each resistance value is $R_f$-$8R_U$, $R_U$, $2R_U$, ..., $16R_U$) and switches $SW_{U1}$, $SW_{U2}$, ..., $16R_{U16}$. In the variable resistor of FIG. 9, tuning resistors $R_U$, $2R_U$, ..., $16R_U$ connected to the common resistor $R_f$-$8R_U$ are switched using the foregoing switches $SW_{U1}$, $SW_{U2}$, ..., $16R_{U16}$. Thus, 16 resistance values from $R_f$-$7R_U$ to $R_f$-$8R_U$ are switchable. The variable width of the variable resistors of FIG. 3 and FIG. 9 refers to a variation in the width of several 10%. FIG. 8 shows the comparative result of the group delay characteristics when the variable width is set to 25% and 25 kΩ is set as the center value. The group delay is defined by multiplying a frequency differential value of a phase by −1, and expresses the delay time in each signal frequency.

In the graph of FIG. 8, the horizontal axis shows signal frequency [Hz], and the vertical axis shows group delay [s]. In FIG. 8, the group delay of the variable resistor of FIG. 3 in each signal frequency is shown by a solid line while the group delay of the variable resistor of FIG. 9 is shown by a broken line. The fluctuation when the resistance value is changed from the minimum value to the maximum value is about 0.4 [ns], that is, the resistance value is stable in the variable resistor of FIG. 3. This is less than ⅕ of the variable resistor of FIG. 9. The group delay of the variable resistor of FIG. 3 is always less than 1 [ns] for any resistance value and it is smaller than that of the variable resistor of FIG. 9.

As described above, the variable resistor according to the first embodiment uses a plurality of coarse tuning resistors and a plurality of fine tuning resistors having a resistance value smaller than the coarse tuning resistors. Thus, it is possible to stably reduce a parasitic capacitance connected to a node between both resistors and the voltage amplitude of the node even if the resistance value is changed. Therefore, the variable resistor according to the first embodiment can suppress the phase fluctuation delay caused by the parasitic capacitance without requiring a tuning circuit, and reduce the phase delay itself.

Second Embodiment

Figure 10:
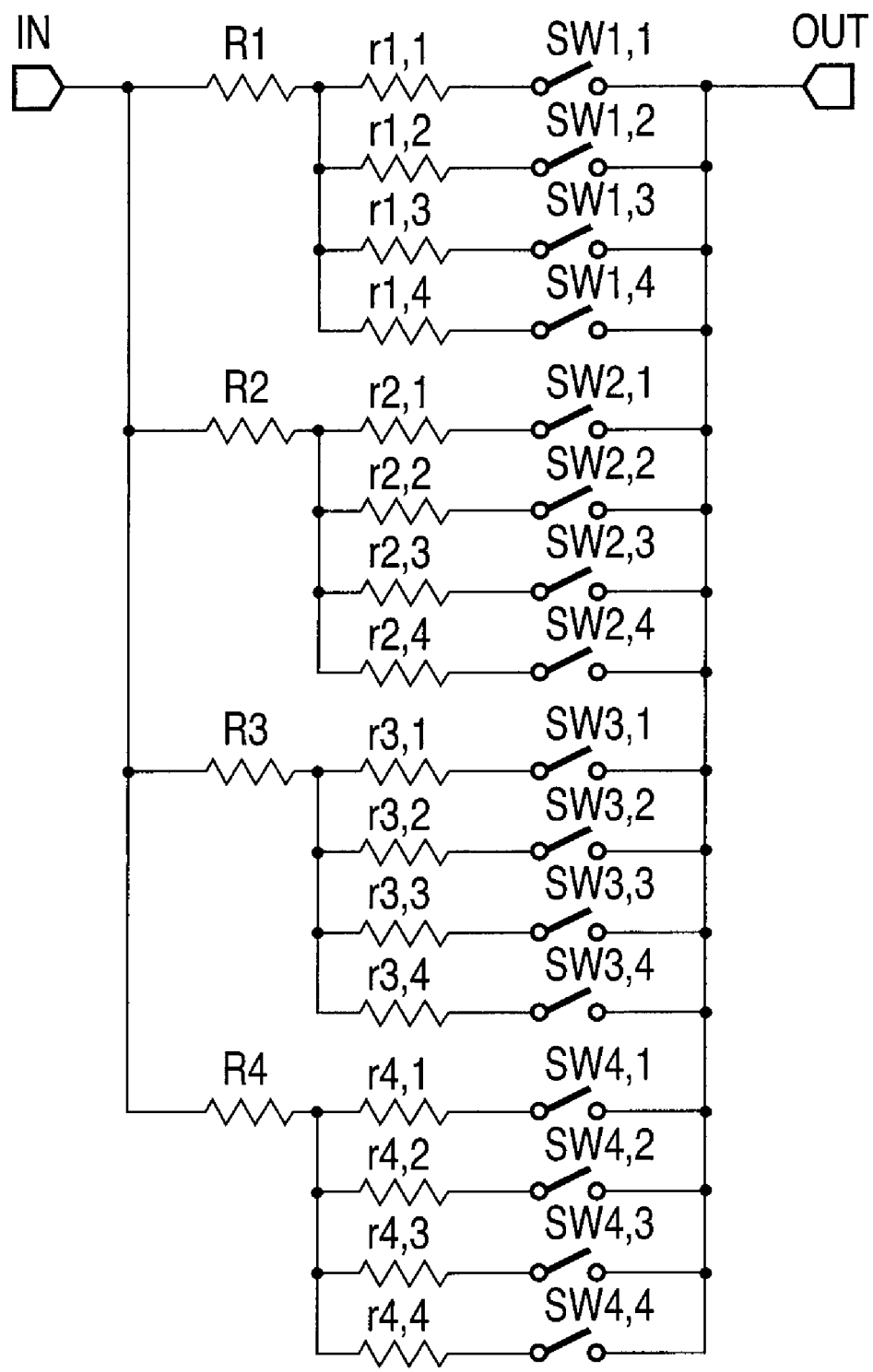
FIG. 10 is a circuit diagram showing a variable resistor according to a second embodiment.

FIG. 10 is a circuit diagram showing a variable resistor according to a second embodiment of the present invention. Specifically, coarse tuning switches $SW_1$, $SW_2$, $SW_3$ and $SW_4$ are removed from the variable resistor of FIG. 3. A current output terminal OUT is directly connected to one end of each of fine tuning switches $SW_{1,1}$, $SW_{1,2}$, $SW_{1,3}$, $SW_{1,4}$, $SW_{2,1}$, $SW_{4,4}$.

Similar to the variable resistor of FIG. 3, in the variable resistor of FIG. 10, each on/off of these fine tuning switches $SW_{1,1}$, $SW_{1,2}$, $SW_{1,3}$, $SW_{1,4}$, $SW_{2,1}$, ..., $SW_{4,4}$ is controlled according to a control signal expressed by a 4-bit control code. Specifically, as shown in FIG. 11, one-to-one correspondence of the control code and the fine tuning switch turned on by the control code is made, and thereby, the variable resistor of FIG. 10 can switch 16 resistance values.

As described above, in the variable resistor according to the second embodiment, coarse tuning switches are removed, and one end of each of the fine tuning switches is directly connected to the current output terminal. Therefore, in the variable resistor according to the second embodiment, the number of switches is reduced, and the influence of the parasitic resistance caused by the coarse tuning switches is also removed.

Third Embodiment

According to the foregoing second embodiment, the fine tuning switches operate exclusively, and are not simultaneously turned on. However, in a variable resistor according to a third embodiment of the present invention, a plurality of fine tuning switches may be turned on at the same time.

The variable resistor according to the third embodiment will be hereinafter described with reference to FIG. 12. A variable resistor of FIG. 12 includes a voltage input terminal IN, four coarse tuning resistors R, eight fine tuning resistors r, 12 fine tuning switches SW and a current output terminal OUT. Thus, the variable resistor can switch 16 resistance values.

One end of each of four coarse tuning resistors $R_{11}$, $R_{12}$, $R_{13}$ and $R_{14}$ (the resistance value is $R_{11}$, $R_{12}$, $R_{13}$ and $R_{14}$) is connected in parallel with the voltage input terminal IN. The other ends of the coarse tuning resistors $R_k$ (k is an arbitrary integer more than 11 and less than 14) is connected with one end of a fine tuning switch $SW_{k,0}$, and connected in parallel with one end of each of fine tuning resistors $r_{k,1}$ and $r_{k,2}$ (the resistance value $r_{k,1}$ and $r_{k,2}$). For simplification of explanation, the relationship between the four resistance values is $R_{11} < R_{12} < R_{13} < R_{14}$. The relationship between the two resistance values connected to the coarse tuning resistor $R_k$ is $r_{k,1} < r_{k,2}$. The resistance value of all fine tuning resistors r is smaller than the minimum resistance value $R_{11}$ of the coarse tuning resistor R. The other end of each of the fine tuning resistors $r_{k,1}$ and $r_{k,2}$ is connected with one end of each of fine tuning switches $SW_{k,1}$ and $SW_{k,2}$. The other end of each of the fine tuning switches SW is connected to the current output terminal OUT.

Figure 12:
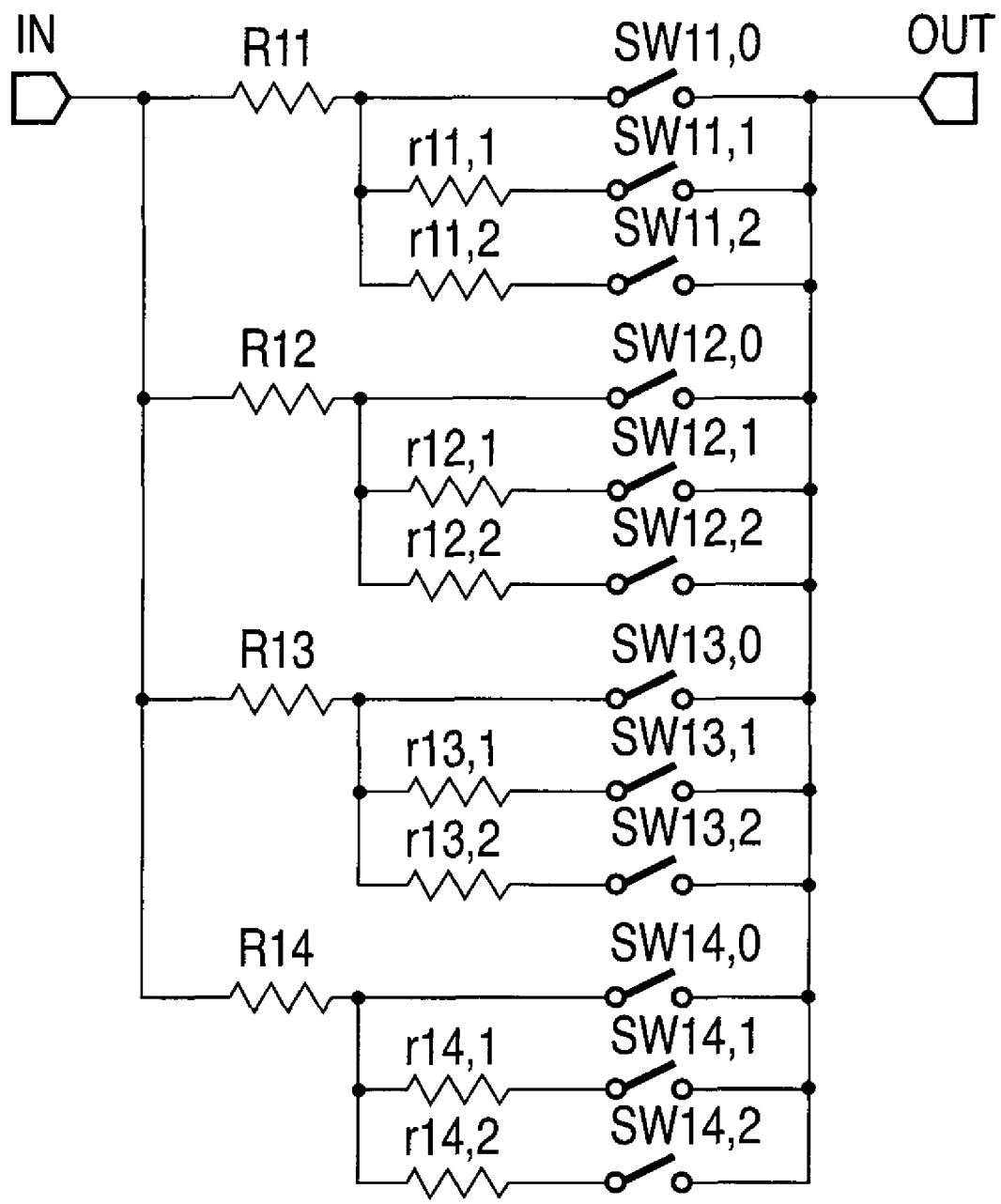
FIG. 12 is a circuit diagram showing a variable resistor according to a third embodiment.

Similar to the variable resistors of FIG. 3 and FIG. 10, in the variable resistor of FIG. 12, each on/off of fine tuning switches $SW_{11,1}$, $SW_{11,2}$, $SW_{12,1}$, ..., $SW_{14,2}$ is controlled according to a control signal expressed by a 4-bit control code. For example, as shown in FIG. 13, the control code and fine tuning switches turned on according to the control code are controlled, and thereby, the variable resistor of FIG. 12 can switch 16 resistance values.

Similar to the foregoing second embodiment, a resistance value when only one fine tuning switch SW is turned on simultaneously will be explained below. In the following description, k represents 11, 12, 13 or 14 according to upper 2-bit of the control code. When the upper 2-bit is "00" then k equals 11, the upper 2-bit is "01" then k equals 12, the upper 2-bit is "10" then k equals 13 and the upper 2-bit is "11" then k equals 14. When the lower 2-bit of the control code is "00", the fine tuning switch $SW_{k,0}$ turns on, and thus, the resistance value of the variable resistor of FIG. 12 is $R_k$. When the lower 2-bit of the control code is "10", the fine tuning switch $SW_{k,1}$ turns on, and thus, the resistance value of the variable resistor of FIG. 12 is $R_k + r_{k,1}$. When the lower 2-bit of the control code is "11", the fine tuning switch $SW_{k,2}$ turns on, and thus, the resistance value of the variable resistor of FIG. 12 is $R_k + r_{k,2}$.

The resistance value when a plurality of fine tuning switches SW simultaneously turn on will be described below. When the lower 2-bit of the control code is "01", the fine tuning switch $SW_{k,1}$ and $SW_{k,2}$ turn on. In this case, the other end of the coarse tuning resistor $R_k$ is connected in parallel with one end of each of fine tuning resistors $r_{k,1}$ and $r_{k,2}$. Thus, the resistance value of the variable resistor of FIG. 12 is $R_k + r_{k,1}//r_{k,2}$. In this case, a symbol "//" shows a parallel connection of resistors. Therefore, when fine tuning switches $SW_{k,1}$ and $SW_{k,2}$ turn on, the same effect as connecting the fine tuning resistor having a resistance value $r_{k,1}//r_{k,2}$ to the coarse tuning resistor $R_k$ is obtained. Incidentally, the resistance value $r_{k,1}//r_{k,2}$ is smaller than $r_{k,1}$; therefore, the resistance value of the fine tuning resistor connected to the coarse tuning resistor $R_k$ is $0 < r_{k,1}//r_{k,2} < r_{k,1} < r_{k,2}$.

As described above, in the variable resistor of this embodiment, a plurality of fine tuning resistors is simultaneously selected, and thereby, the number of switchable resistance is increased. Therefore, in the variable resistor of this embodiment, it is possible to relatively reduce the number of fine tuning resistors and switches. In FIG. 12, 0Ω (short) is provided as the fine tuning resistor; however, the 0Ω fine tuning resistor need not be provided. Three fine tuning resistors or more may be selected at the same time.

Fourth Embodiment

A variable resistor according to a fourth embodiment of the present invention has the following configuration. Specifically, a common resistor $R_C$ is interposed between the coarse tuning resistor described in the first to third embodiments and a voltage input terminal IN.

As shown in FIG. 14, the common resistor $R_C$ (the resistance value is $R_C$) is provided in the variable resistor of FIG. 12, and thereby, the resistance value of each coarse tuning resistor $R_k$ is replaced with $R_k - R_C$. When a resistor is formed on a silicon substrate, the circuit area monotonously increases with respect to the resistance value. Thus, a portion in common to the coarse tuning resistor is provided, and thereby, the circuit area can be reduced.

As described above, in the variable resistor according to the fourth embodiment, the common resistor is interposed between the coarse tuning resistor and the voltage input terminal. Therefore, in the variable resistor according to this embodiment, the resistance value of each coarse tuning resistor is relatively reduced to reduce the circuit area.

Fifth Embodiment

The variable resistors according to the foregoing first to fourth embodiments are applicable to an active filter. According to the fifth embodiment of the present invention, an active filter is configured using the variable resistor according to any of the first to fourth embodiments, an operational amplifier and a capacitor.

Figure 15B:
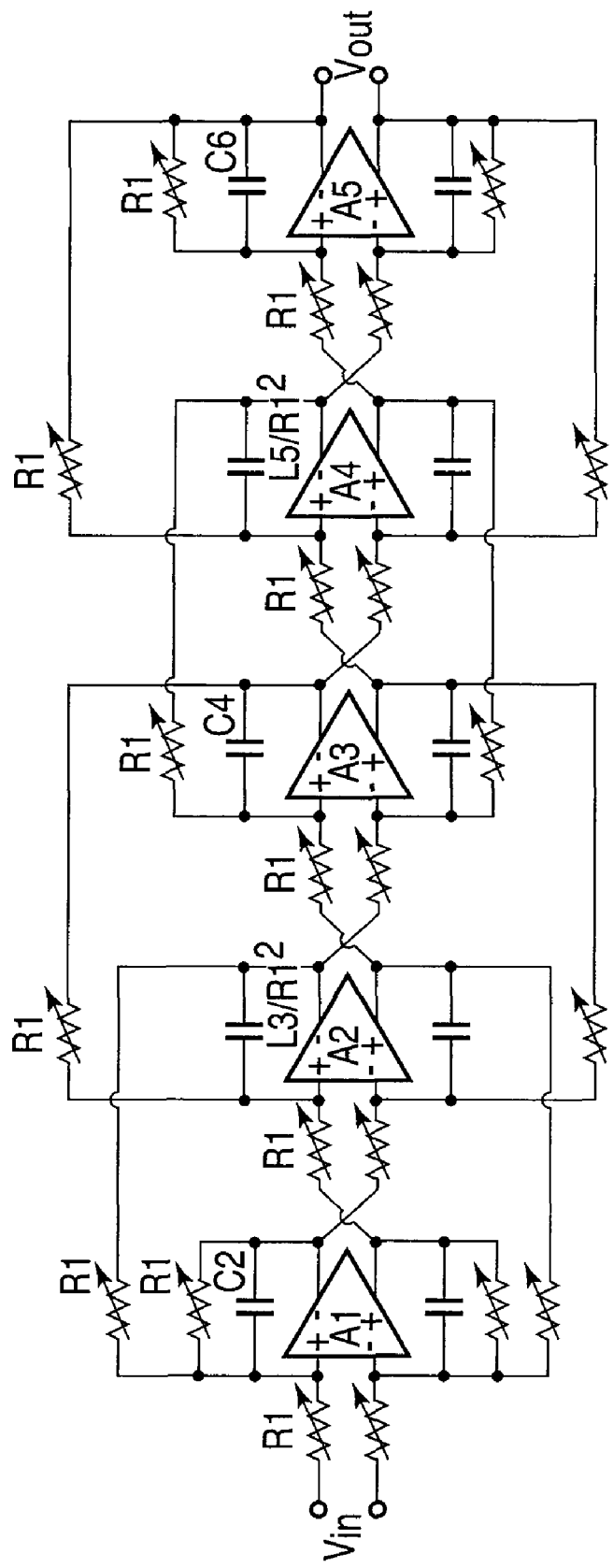
FIG. 15B is a circuit diagram showing an active filter equivalent to the LC filter of FIG. 15A configured using the variable resistor according to any of the first to fourth embodiments.

An active filter shown in FIG. 15B is configured from a $5^{th}$ resistance doubly terminated type LC filter shown in FIG. 15A using the variable resistor according to any of the first to fourth embodiments. In the active filter of FIG. 15B, an input terminal of an operational amplifier is connected with a current output terminal OUT of the variable resistor according to any of the first to fourth embodiments. In this way, signal distortion is suppressed while phase rotation is also suppressed. The resistance value of the variable resistor is switched, and thereby, scaling of a cut-off frequency is performed to switch a bandwidth. In addition, the resistance value of the variable resistor is changed, and thereby, it is possible to compensate for any process variation of capacitors or resistors.

As described above, the active filter according to this embodiment is configured using the variable resistor according to any of the first to fourth embodiments. Therefore, in the filter of this embodiment, the resistance value of the variable resistor is switched to vary a bandwidth, and any process variation of capacitors or resistors can be compensated.

Sixth Embodiment

The variable resistors according to the first to fourth embodiments are applicable to a variable gain amplifier. According to the sixth embodiment of the present invention, the variable gain amplifier is configured using the variable resistor according to any of the first to fourth embodiments and an operational amplifier.

As shown in FIG. 16, the variable gain amplifier of this embodiment has the following configuration. According to the configuration, an input terminal of an operational amplifier is connected with a current output terminal OUT of variable resistors VR11 and VR12 according to any of the first to fourth embodiments. In this way, signal distortion is reduced, and phase rotation is suppressed. Negative feedback is applied to an output of the operational amplifier by variable resistors VR21 and VR22 according to any of the first to fourth embodiments. The gain of the variable gain amplifier of this embodiment is switchable by changing each resistance value of the variable resistors VR11, VR12, VR21 and VR22.

As described above, the variable gain amplifier of this embodiment is configured using the variable resistor according to any of the first to fourth embodiments. Therefore, the variable gain amplifier of this embodiment is operable in a wide bandwidth because the signal phase delay is relatively suppressed in the variable resistors.

Seventh Embodiment

The filter of the fifth embodiment and the variable gain amplifier of the sixth embodiment are applicable to a transceiver system of a wireless communication device. According to a seventh embodiment of the present invention, a receiver is configured using the filter of the fifth embodiment and the variable gain amplifier of the sixth embodiment.

As seen from FIG. 17, a receiver of this embodiment includes an antenna 101, a low noise amplifier 102, a frequency converter 103, a filter 104, a variable gain amplifier 105 and an analog-to-digital converter 106.

The antenna 101 receives an RF signal, and then, inputs the received signal to the low noise amplifier 102. The low noise amplifier 102 amplifies the foregoing received signal. The frequency converter 103 down-converts the received signal amplified by the low noise amplifier 102 to input a received baseband signal to the filter 104.

The filter 104 is the filter described in the foregoing fifth embodiment, and removes interferences from the received baseband signal. The variable gain amplifier 105 is the variable gain amplifier described in the foregoing sixth embodiment, and amplifies the received baseband signal, the interferences of which was removed by the filter 104, to a desired signal level. Thereafter, the variable gain amplifier 105 sends the foregoing received baseband signal to the analog-to-digital converter 106.

The analog-to-digital converter 106 converts the received baseband signal amplified by the variable gain amplifier 105 to a digital received signal. The digital received signal is demodulated and decoded by a digital processor (not shown).

As described above, the receiver of this embodiment is configured using the filter of the fifth embodiment and the variable gain amplifier of the sixth embodiment. Therefore, the receiver of this embodiment can obtain high demodulation accuracy because the signal phase delay is relatively suppressed in the filter and the variable gain amplifier.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A variable resistor formed on a silicon substrate, and changing a resistance value between an input terminal and an output terminal, comprising:
   a plurality of first resistors each having one end connected in common to the input terminal, and each having an other end;
   a plurality of second resistor groups resistors each second resistor having a resistance value smaller than the first resistors, and said second resistors of each respective group having one end connected to the other end of a respective one of the first resistors; and
   a switch group interposed between other ends of the second resistors and the output terminal, and selecting one from the first resistors, and further, selecting at least one from the second resistors connected to the other end of the selected first resistor of each respective group.

2. The variable resistor according to claim 1, wherein the switch group includes a plurality of switches connected in series to each of the second resistors so that turn on/off is controlled by a control signal.

3. The variable resistor according to claim 1, wherein the switch group includes a plurality of first switches connected in series to each of the second resistors so that turn on/off is controlled by a control signal, and a plurality of second switches connected in series to each of the first resistors so that turn on/off is controlled by the control signal.

4. The variable resistor according to claim 1, wherein each resistance value of the first resistors is different, and each resistance value of the first resistors and second resistors is set so that when the switch group switches the selection of the first resistors so as to increase the resistance value, sum of a resistance value of the selected first resistor by the switch group and a resistance value of the selected second resistor by the switch group increases without relation to the selection of the second resistors.

5. An active filter including:
   an operational amplifier;
   the variable resistor according to claim 1 connected to the operational amplifier; and
   a capacitor connected to the operational amplifier.

6. A variable gain amplifier including:
   an operational amplifier; and
   the variable resistor according to claim 1 connected to the operational amplifier.

7. An integrated circuit including the variable resistor according to claim 1.

8. A variable resistor formed on a silicon substrate, and changing a resistance value between an input terminal and an output terminal, comprising:
   a first resistor having one end connected to the input terminal, and having an other end;
   a plurality of second resistors each having one end connected in common to the other end of the first resistor, and each having an other end;
   a plurality of third resistor groups each third resistor having a resistance value smaller than the second resistors, and said third resistors of each respective group having one end connected to the other end of a respective one of the second resistors, and each having an other end; and
   a switch group interposed between the other end of the third resistor and the output terminal, and selecting one from the second resistors, and further, selecting at least one from the third resistors connected to the other end of the selected second resistor, of each respective group.

9. The variable resistor according to claim 8, wherein the switch group includes a plurality of switches connected in series to each of the third resistors so that turn on/off is controlled by a control signal.

10. The variable resistor according to claim 8, wherein the switch group includes a plurality of first switches connected in series to each of the third resistors so that turn on/off is controlled by a control signal, and a plurality of second switches connected in series to each of the second resistors so that turn on/off is controlled by the control signal.

11. The variable resistor according to claim 8, wherein each resistance value of the second resistors is different, and each resistance value of the second resistors and third resistors is set so that when the switch group switches the selection of the second resistors so as to increase the resistance value, sum of a resistance value of the selected second resistor by the switch group and a resistance value of the selected third resistor by the switch group increases without relation to the selection of the third resistors.

* * * * *